US009812381B1

(12) United States Patent
Wu et al.

(10) Patent No.: US 9,812,381 B1
(45) Date of Patent: Nov. 7, 2017

(54) INTEGRATED FAN-OUT PACKAGE AND METHOD OF FABRICATING THE SAME

(71) Applicant: Taiwan Semiconductor Manufacturing Co., Ltd., Hsinchu (TW)

(72) Inventors: Chi-Hsi Wu, Hsinchu (TW); Chun-Yi Liu, Hsinchu (TW); Der-Chyang Yeh, Hsin-Chu (TW); Hsien-Wei Chen, Hsinchu (TW); Shih-Peng Tai, Hsinchu County (TW); Chuen-De Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/201,604

(22) Filed: Jul. 4, 2016

Related U.S. Application Data

(60) Provisional application No. 62/343,131, filed on May 31, 2016.

(51) Int. Cl.
| | |
|---|---|
| H01L 21/00 | (2006.01) |
| H01L 23/495 | (2006.01) |
| H01L 23/31 | (2006.01) |
| H01L 21/48 | (2006.01) |
| H01L 21/56 | (2006.01) |
| H01L 25/065 | (2006.01) |

(52) U.S. Cl.
CPC .... *H01L 23/49527* (2013.01); *H01L 21/4821* (2013.01); *H01L 21/4825* (2013.01); *H01L 21/565* (2013.01); *H01L 23/3114* (2013.01); *H01L 23/3178* (2013.01); *H01L 23/4952* (2013.01); *H01L 23/49589* (2013.01); *H01L 25/0655* (2013.01)

(58) Field of Classification Search
CPC ........... H01L 23/49527; H01L 23/4952; H01L 23/3178
See application file for complete search history.

(56) References Cited

U.S. PATENT DOCUMENTS

| | | | | |
|---|---|---|---|---|
| 8,361,842 B2* | 1/2013 | Yu | .......................... | H01L 21/561 257/E21.499 |
| 8,680,647 B2* | 3/2014 | Yu | ....................... | H01L 23/3192 257/528 |

(Continued)

*Primary Examiner* — Laura Menz
(74) *Attorney, Agent, or Firm* — JCIPRNet

(57) ABSTRACT

An integrated fan-out package is described. The integrated fan-out package comprises a first die and a second die arranged adjacent to each other. A molding compound encapsulates the first and second dies. A redistribution structure is disposed over the molding compound and on the first and second dies. The redistribution structure comprises a first connection structure electrically connected to the first die, a second connection structure electrically connected to the second die and an inter-dielectric layer located between the first and second connection structures and separating the first connection structure from the second connection structure. The ball pad is disposed on the redistribution structure and electrically connected with the first die or the second die. The bridge structure is disposed on the first connection structure and on the second connection structure and electrically connects the first die with the second die.

20 Claims, 5 Drawing Sheets

(56) References Cited

U.S. PATENT DOCUMENTS

| | | | |
|---|---|---|---|
| 8,703,542 B2 | 4/2014 | Lin et al. | |
| 8,759,964 B2* | 6/2014 | Pu | H01L 21/561 |
| | | | 257/690 |
| 8,778,738 B1 | 7/2014 | Lin et al. | |
| 8,785,299 B2* | 7/2014 | Mao | H01L 23/48 |
| | | | 257/678 |
| 8,803,306 B1 | 8/2014 | Yu et al. | |
| 8,809,996 B2* | 8/2014 | Chen | H01L 23/3192 |
| | | | 257/516 |
| 8,829,676 B2* | 9/2014 | Yu | H01L 21/568 |
| | | | 257/737 |
| 8,877,554 B2 | 11/2014 | Tsai et al. | |
| 9,484,227 B1* | 11/2016 | Cheng | H01L 21/561 |
| 9,640,521 B2* | 5/2017 | Chang | H01L 25/18 |
| 2011/0291288 A1 | 12/2011 | Wu et al. | |
| 2013/0062760 A1 | 3/2013 | Hung et al. | |
| 2013/0062761 A1 | 3/2013 | Lin et al. | |
| 2013/0105973 A1* | 5/2013 | Gan | H01L 23/3121 |
| | | | 257/738 |
| 2013/0105991 A1* | 5/2013 | Gan | H01L 25/105 |
| | | | 257/777 |
| 2013/0168848 A1 | 7/2013 | Lin et al. | |
| 2013/0187270 A1* | 7/2013 | Yu | H01L 23/5389 |
| | | | 257/737 |
| 2013/0264684 A1 | 10/2013 | Yu et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0235915 A1* | 8/2015 | Liang | H01L 23/145 |
| | | | 361/764 |
| 2015/0235989 A1* | 8/2015 | Yu | H01L 25/50 |
| | | | 257/712 |
| 2016/0035622 A1* | 2/2016 | Kumar | H01L 21/76852 |
| | | | 257/738 |
| 2016/0093597 A1* | 3/2016 | Chang | H01L 24/32 |
| | | | 257/737 |
| 2017/0084590 A1* | 3/2017 | Yu | H01L 23/5389 |
| 2017/0141053 A1* | 5/2017 | Chen | H01L 21/565 |
| 2017/0141080 A1* | 5/2017 | Chen | H01L 25/0657 |
| 2017/0179083 A1* | 6/2017 | Lin | H01L 25/0657 |

* cited by examiner

INTEGRATED FAN-OUT PACKAGE AND METHOD OF FABRICATING THE SAME

CROSS-REFERENCE TO RELATED APPLICATION

This application claims the priority benefits of U.S. provisional application Ser. No. 62/343,131, filed on May 31, 2016. The entirety of the above-mentioned patent application is hereby incorporated by reference herein and made a part of specification.

BACKGROUND

The rapid growth of the semiconductor industry is mostly attributed to continuous improvements in the integration density of various electronic components (i.e., transistors, diodes, resistors, capacitors, etc.). For the most part, this improvement in integration density has come from repeated reductions in minimum feature sizes, which allows more of the smaller components to be integrated into a given area. These smaller electronic components also require smaller packages that utilize less area than previous packages. Integrated fan-out packages become increasingly popular for their compactness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
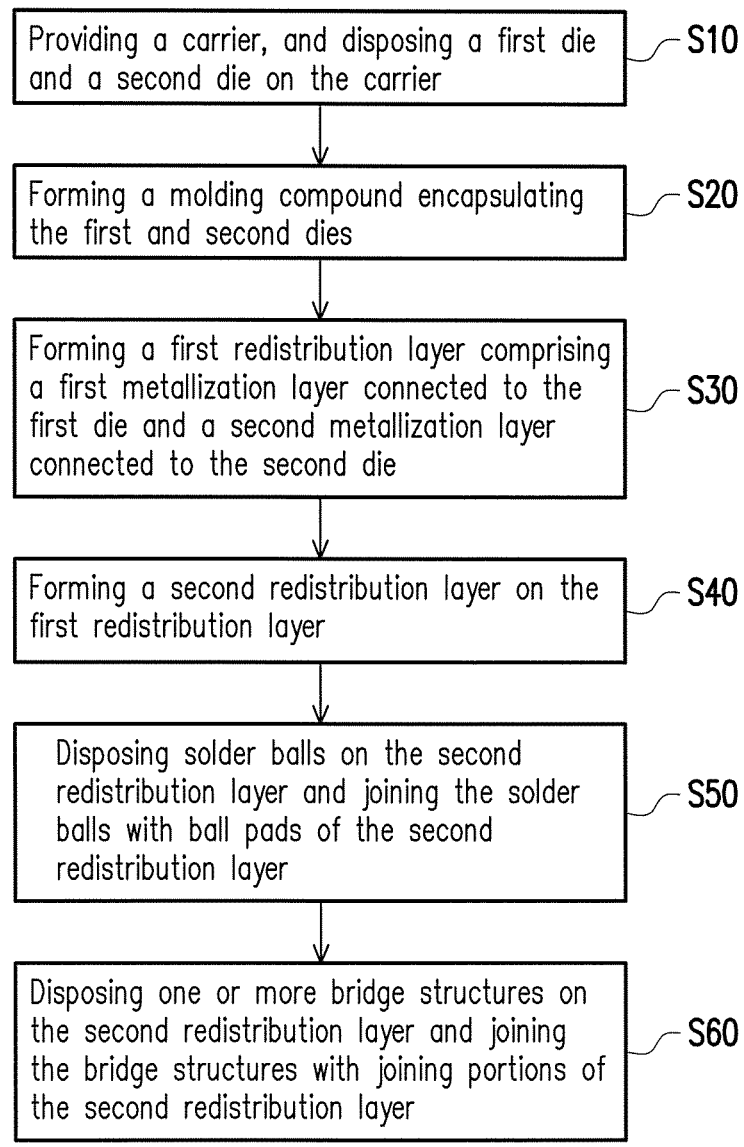
FIG. 1 is an exemplary flow chart showing the process steps of the method of fabricating an integrated fan-out package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is an exemplary flow chart showing the process steps of the method of fabricating an integrated fan-out package in accordance with some embodiments of the present disclosure. The various process steps of the process flow illustrated in FIG. 1 may comprise multiple process steps as discussed below. FIGS. 2A-2H are the schematic cross-sectional views showing the integrated fan-out package at various stages of the method of fabricating an integrated fan-out package according to some embodiments of the present disclosure. It is to be noted that the process steps described herein cover a portion of the manufacturing processes used to fabricate an integrated fan-out package. The embodiments are intended to provide further explanations but are not used to limit the scope of the present disclosure.

Figure 2A:
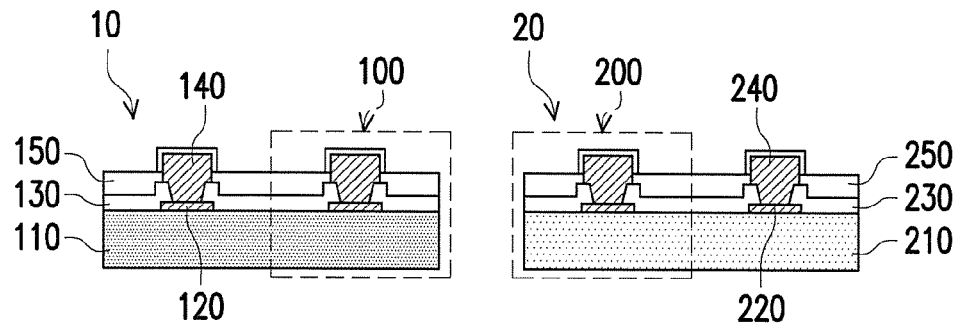
FIGS. 2A-2H are the schematic cross-sectional views showing the integrated fan-out package at various stages of the method of fabricating an integrated fan-out package according to some embodiments of the present disclosure.

In accordance with some embodiments, referring to FIG. 2A, a first wafer 10 including a plurality of first die 100 and a second wafer 20 including a plurality of second die 200 are provided. The die(s) described herein may be referred as a chip or an integrated circuit (IC). In some embodiments, the first wafer 10 includes a semiconductor substrate 110, a plurality of conductive pads 120 formed on the semiconductor substrate 110, and a passivation layer 130. In one embodiment, the passivation layer 130 is formed over the substrate 110 and has a plurality of opening so as to partially expose the conductive pads 120. In some embodiments, the second wafer 20 includes a semiconductor substrate 210, a plurality of conductive pads 220 formed on the semiconductor substrate 210, and a passivation layer 230. In one embodiment, the passivation layer 230 is formed over the substrate 210 and has a plurality of opening so as to partially expose the conductive pads 220. In some embodiments, the semiconductor substrate 110/210 is a silicon substrate including active components (e.g., transistors, diodes, optoelectronic devices or the like) and passive components (e.g., resistors, capacitors, inductors, transducers or the like) formed therein. In certain embodiments, the conductive pads 120/220 are aluminum pads, copper pads or other suitable metallic pads. In some embodiments, the passivation layer 130/230 includes a silicon oxide layer, a silicon nitride layer, a silicon oxy-nitride layer or a dielectric layer formed by other suitable dielectric materials.

Referring to FIG. 2A, in some embodiments, a plurality of conductive pillars 140 are formed on the exposed conductive pads 120 of the first wafer 10, and a protection layer 150 is formed on the passivation layer 130 but the conductive pillars 140 are exposed out of the protection layer 150. Similarly, in some embodiments, a plurality of conductive pillars 240 are formed on the conductive pads 220 of the second wafer 20, and a protection layer 250 is formed on the passivation layer 230 without covering the conductive pillars 240. In some embodiments, the conductive pillars 140 and conductive pillars 240 are copper pillars or copper alloy pillars. Furthermore, in some embodiments, the protection layer 150 or the protection layer 250 includes a polymer layer having sufficient thickness to protect the conductive pillars (140/240). For example, the protection layer 150/250 includes a polybenzoxazole (PBO) layer, a polyimide (PI) layer or layers of other suitable polymer materials. In some alternative embodiments, the protection layer 150/250 may be made of inorganic materials.

Figure 2B:
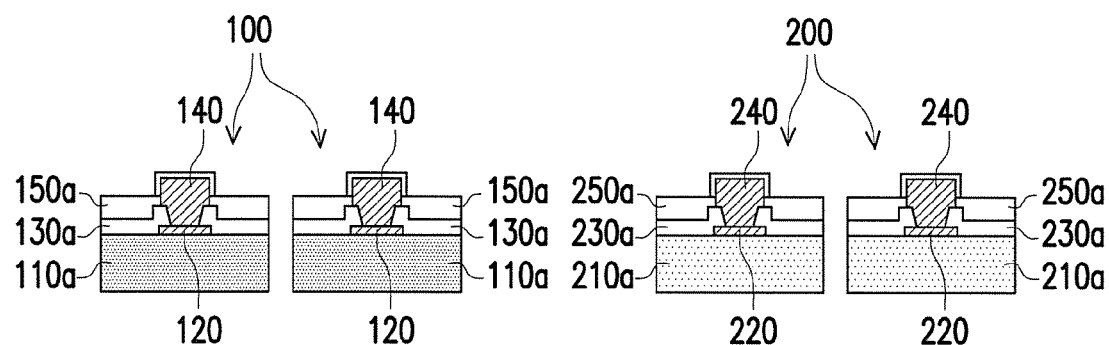

Referring to FIG. 2B, in certain embodiments, a wafer dicing process is performed to the first wafer 10 and the second wafer 20, such that the first dies 100 of the first wafer 10 and the second dies 200 of the second wafer 20 are singulated from one another. As shown in FIG. 2B, the singulated first die 100 includes a semiconductor substrate 110a, the conductive pads 120 formed on the semiconductor substrate 110a, a passivation layer 130a, the conductive pillars 140, and a protection layer 150a. Similarly, the singulated second die 200 includes a semiconductor substrate 210a, the conductive pads 220 formed on the semiconductor substrate 210a, a passivation layer 230a, the conductive pillars 240, and a protection layer 250a. In certain embodiments, a back side grinding process is performed on the rear surfaces of the first wafer 10 and the second wafer 20 after the protection layer 150/250 are formed and before the wafer dicing process is performed. During the back side grinding process, the semiconductor substrate 110/210 is grinded and thinned.

Figure 2C:
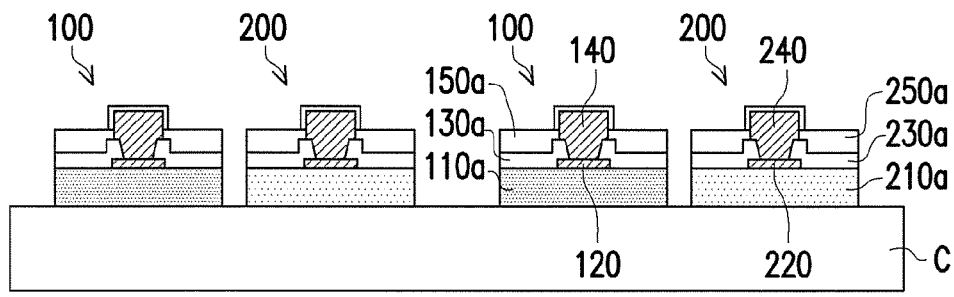

FIG. 2C illustrates a cross-sectional view of the integrated fan-out package at one of various stages of the fabricating method. Referring to step S10 in FIG. 1 and as shown in FIG. 2A, a carrier C is provided. In some embodiments, the carrier C may be a glass carrier or any suitable carrier for the fabricating method of the integrated fan-out package. In some embodiments, the carrier C is coated with a debond layer (not shown) and/or a dielectric material layer (not shown). The material of the debond layer may be any material suitable for debonding the carrier C from the above layers disposed thereon. In certain embodiments, at least one first die 100 and at least one second die 200 are disposed on the carrier C, and the first die 100 and the second die 200 are arranged adjacent to each other. In some embodiments, one or more first dies 100 and one or more second dies 200 may be picked and then placed on the carrier C. In some embodiments, the first die 100 is a memory chip and the second die 200 is an application processor chip. However, in other embodiments, the first die 100 is an application processor chip and the second die 200 is a memory chip. In the present disclosure, the types of the first die(s) 100 and the second die(s) 200 are chosen based on the product requirements, but are not particularly limited thereto.

Figure 2D:
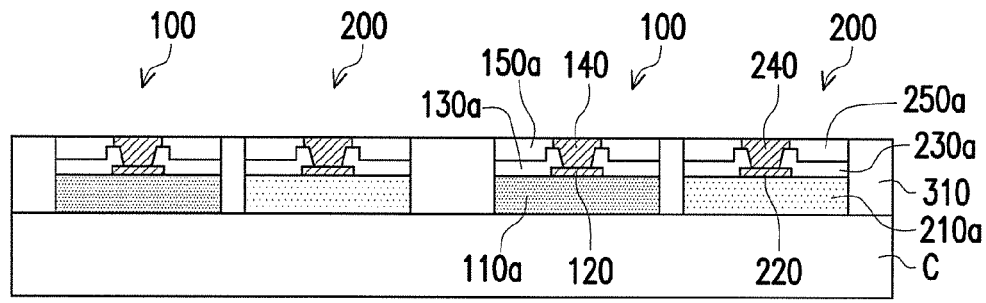

In step S20 in FIG. 1 and as shown in FIG. 2D, a molding compound 310 is formed encapsulating the first dies 100 and the second dies 200 on the carrier C. In some embodiments, the molding compound 310 includes, for example, an epoxy resin or any other suitable type of molding materials. In some embodiments, the molding compound 310 fills the gaps between the first dies 100 and the second dies 200 and covers the first dies 100 and the second dies 200. Furthermore, in certain embodiments, the molding compound 310 is planarized to expose the conductive pillars 140 of the first dies 100 and the conductive pillars 240 of the second dies 200. In some embodiments, the molding compound 310 is polished until the conductive pillars 140 of the first dies 100 and the conductive pillars 240 of the second dies 200 are exposed for further connection. In one embodiment, after grinding, top surfaces of the molding compound 310, the first die(s) 100 and the second die(s) 200 become substantially coplanar. Furthermore, in some embodiments, the molding compound 310, the first dies 100 and the second dies 200 are planarized through a grinding process or a chemical mechanical polishing (CMP) process. After the grinding process, a cleaning step may be optionally performed, for example to clean and remove the residues generated from the grinding step. However, the disclosure is not limited thereto, and the planarizing step may be performed through any other suitable method.

Figure 2E:
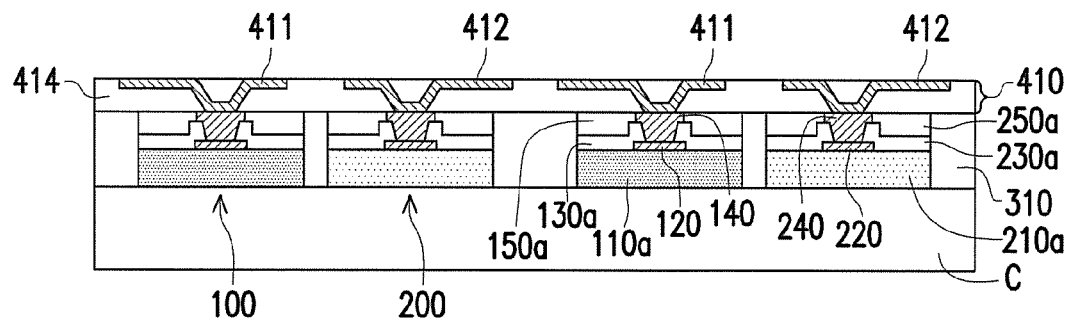
Figure 2F:
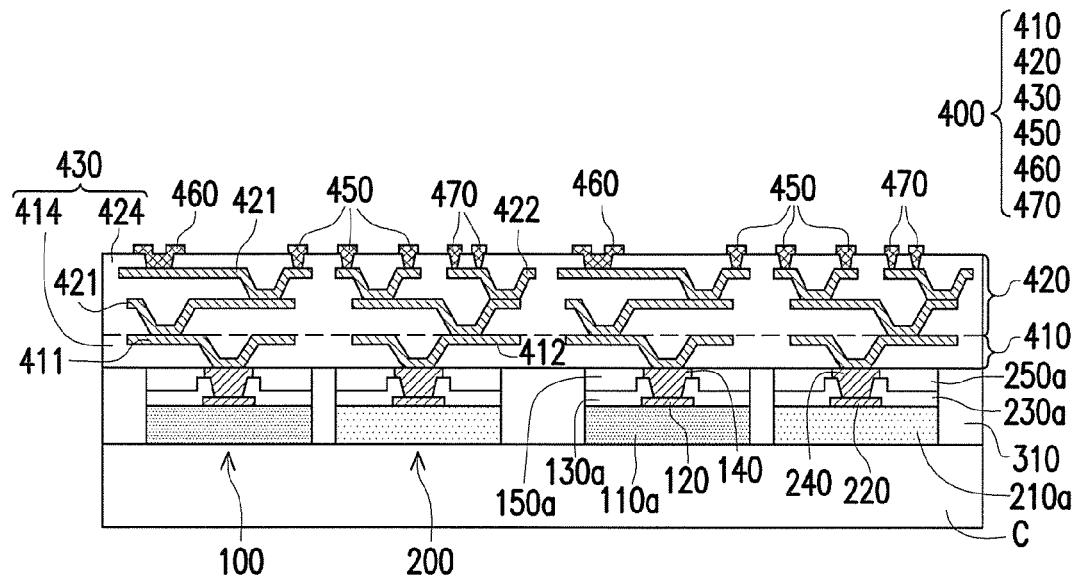

In step S30, step S40 in FIG. 1 and as shown in FIGS. 2E-2F, a redistribution structure 400 is formed over the molding compound 310 and on the first dies 100 and the second dies 200. In some embodiments, the formation of the redistribution structure 400 comprises forming a first redistribution layer 410 and forming a second redistribution layer 420.

In certain embodiments, as shown in FIG. 2E, a first redistribution layer 410 is formed. The first redistribution layer 410 at least comprises a first metallization layer 411 (part of first connection structure) connected to the first die 100, a second metallization layer 412 (part of second connection structure) connected to the second die 200 and a lower inter-dielectric layer 414 isolating the first and second metallization layers 411, 412. In one embodiment, the formation of the first redistribution layer 410 includes forming the lower inter-dielectric layer(s) 414, patterning the lower inter-dielectric layer(s) 414, forming a metal layer (not shown) over the lower inter-dielectric layer(s) 414 and patterning the metal layer to form the first and second metallization layers 411, 412. In some embodiments, the first die 100 is electrically connected with the first metallization layer 411 through the conductive pads 120 and conductive pillars 140, and the second die 200 is electrically connected with the second metallization layer 412 through the conductive pads 220 and conductive pillars 240. In certain embodiments, the first metallization layer 411 and the second metallization layer 412 are physically and electrically separate from each other, and at this point, the first die 100 is electrically isolated from the second die 200. In some embodiments, the lower inter-dielectric layer 414 sandwiched between the first metallization layer 411 and the second metallization layer 412 electrically isolates the first metallization layer 411 from the second metallization layer 412. In some embodiments, the material of the first metallization layer 411 or the second metallization layer 421 includes aluminum, titanium, copper, nickel, tungsten, and/or alloys thereof. In some embodiments, the lower inter-dielectric layer 414 includes more than one dielectric layers.

Referring to FIG. 2F, in certain embodiments, a second redistribution layer 420 is formed on the lower inter-dielectric layer 414. The methods for forming the second redistribution layer 420 are similar to those of the first redistribution layer 410. The second redistribution layer 420 comprises a plurality of metallization layers 421 and 422 stacked with upper inter-dielectric layers 424. In some embodiments, the formation of the second redistribution layer 420 comprises forming and patterning a plurality of dielectric layers and a plurality of conductive layers alternately to form the alternately stacked upper inter-dielectric layers 424 and metallization layers 421/422. In certain embodiments, the lower inter-dielectric layer 414 and the upper inter-dielectric layers 424 constitute the inter-dielectric layer 430. In certain embodiments, the metallization layers 421 and the first metallization layer 411 may be referred as first connection structure of the redistribution structure 400, while the metallization layers 422 and the second metallization layer 412 are referred as a second connection structure of the redistribution structure 400. In some embodiments, the inter-dielectric layer 430 located between the first and second redistribution layers 410, 420 physically and electrically separating the first connection structure from the second connection structure. In some embodiments, the materials of the inter-dielectric layer 430 include one or more polymer dielectric materials such as polyimide, benzocyclobutene (BCB), polybenzooxazole (PBO), or any other suitable polymer-based dielectric materials. In some embodiments, the metallization layers 421 are electrically connected to the first metallization layer 411, and the metallization layers 422 are electrically connected to the second metallization layer 412. In certain embodiments, the metallization layers 421 and the metallization layers 422 are physically and electrically separate from each other, and at this point, the first die 100 is electrically isolated from the second die 200. In some embodiments, the materials of the metallization layers 421 and 422 may be similar to or different from those of the first metallization layer 411 and the second metallization layer 412. In certain embodiments, the metallization layers 421 and 422 include routing patterns for fan-out, traces, metal lines and/or contact pads.

Referring to FIG. 2F, in some embodiments, a plurality of joining portions 450, ball pads 460 and contact structures 470 are formed on the second redistribution layer 420 of the redistribution structure 400. In certain embodiments, some of the joining portions 450 are arranged on the metallization layer 421 and the electrically connected with the first die 100 through the first metallization layer 411 and the metallization layers 421, while some other of the joining portions 450 are arranged on the metallization layer 422 and electrically connected with the second die 200 through the second metallization layer 412 and the metallization layers 422. In certain embodiments, the ball pads 460 or the contact structures 470 may be arranged on either the metallization layer 421 or the metallization layer 422 and either electrically connected with the first die 100 through the first metallization layer 411 and the metallization layers 421 or electrically connected to the second die 200 through the second metallization layer 412 and the metallization layers 422. In some embodiments, as shown in FIG. 2F, the joining portions 450, ball pads 460 and contact structures 470 are formed by patterning part of the upper inter-dielectric layers 424 to expose the underlying metallization layer 421 and the metallization layer 422, forming a metal layer (not shown) on the patterned upper inter-dielectric layer 424 and then patterning to form the joining portions 450, ball pads 460 and contact structures 470. The materials of the joining portions 450, ball pads 460 and contact structures 470 include copper, nickel, aluminum, tungsten or alloys thereof.

Figure 2G:
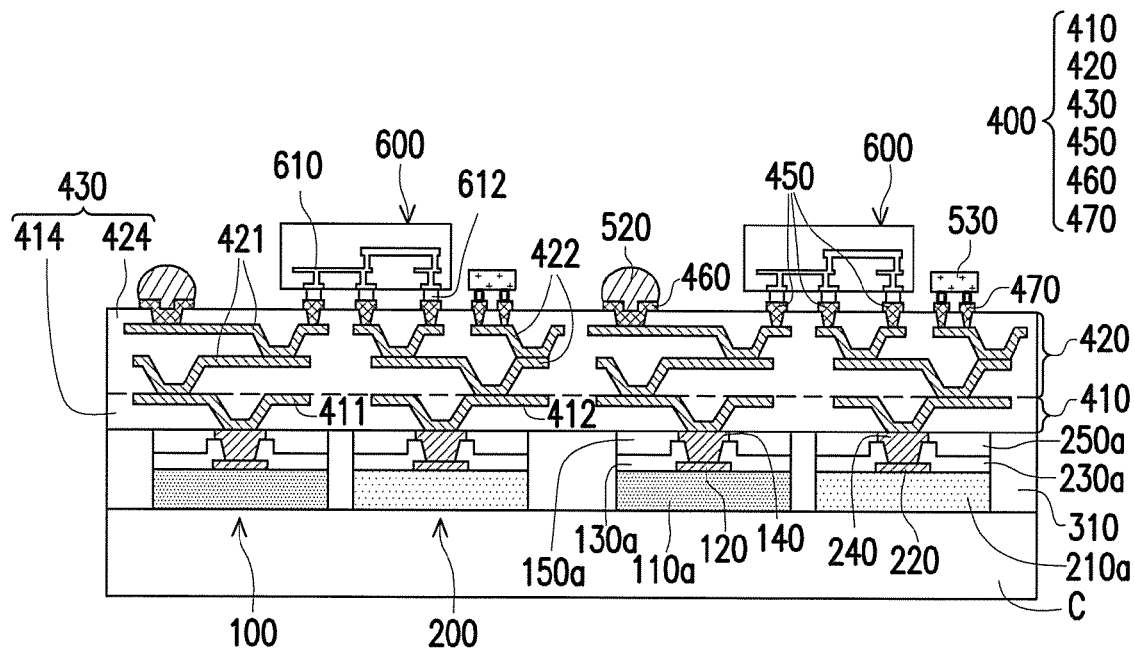

In step S50 of FIG. 1 and as shown in FIG. 2G, solder balls 520 are disposed on the second redistribution layer 420. In some embodiments, the solder balls 520 are joined with the ball pads 460 of the second redistribution layer 420 through a solder flux. In certain embodiments, semiconductor devices such as integrated passive devices (IPD) 530 are disposed on the contact structures 470 on the second redistribution layer 420 and are electrically connected to the redistribution structure 400 through the contact structures 470. In some embodiments, the contact structures 470 connecting the integrated passive devices 530 to the metallization layer 422 (part of second connection structure) may be bumps.

Furthermore, in step S60 in FIG. 1 and as shown in FIG. 2G, one or more bridge structures 600 are disposed on the joining portions 450 on the second redistribution layer 420. In certain embodiments, at least one of the bridge structures 600 is joined with both the joining portions 450 on the metallization layer 421 and the joining portions 450 on the metallization layer 422 of the second redistribution layer 420, so that the first die 100 is electrically connected to the second die 200 through the first redistribution layer 410, the second redistribution layer 420 and the bridge structure 600. In some embodiments, the bridge structure 600 comprises an interconnect structure 610 formed therein and bonding structures 612 connected to the interconnection structure 610. In some embodiments, the interconnection structure 610 of the bridge structure 600 comprises alternately stacked metal layers and dielectric layers. In certain embodiments, the bridge structures 600 may be prepared by forming the interconnect structure in a semiconductor wafer or a semiconductor substrate (not shown), forming the bonding structures over the interconnect structure and then dicing the semiconductor wafer for obtaining individual bridge structures. In some embodiments, the bridge structure 600 is joined with the joining portions 450 on the metallization layer 421 and the metallization layer 422 of the second redistribution layer 420 through the bonding structures 612 of the bridge structure 600, which allows the bridge structure 600 to be electrically connected to both of the first die 100 and the second die 200 and the first dies 100 and the second die 200 to be electrically connected to each other.

In some embodiments, the bonding of the bridge structure 600 with joining portions 450 is performed after disposing the solder balls 520 on the ball pads 460. In certain embodiments, the bonding of the bridge structure 600 with joining portions 450 is via eutectic bonding between the bonding structures 612 and the joining portions 450. In some embodiments, the material of the bonding structures 612 is similar with that of the joining portions 450. However, the disclosure is not particularly limited thereto, and other type of suitable bonding methods may be utilized.

Figure 2H:
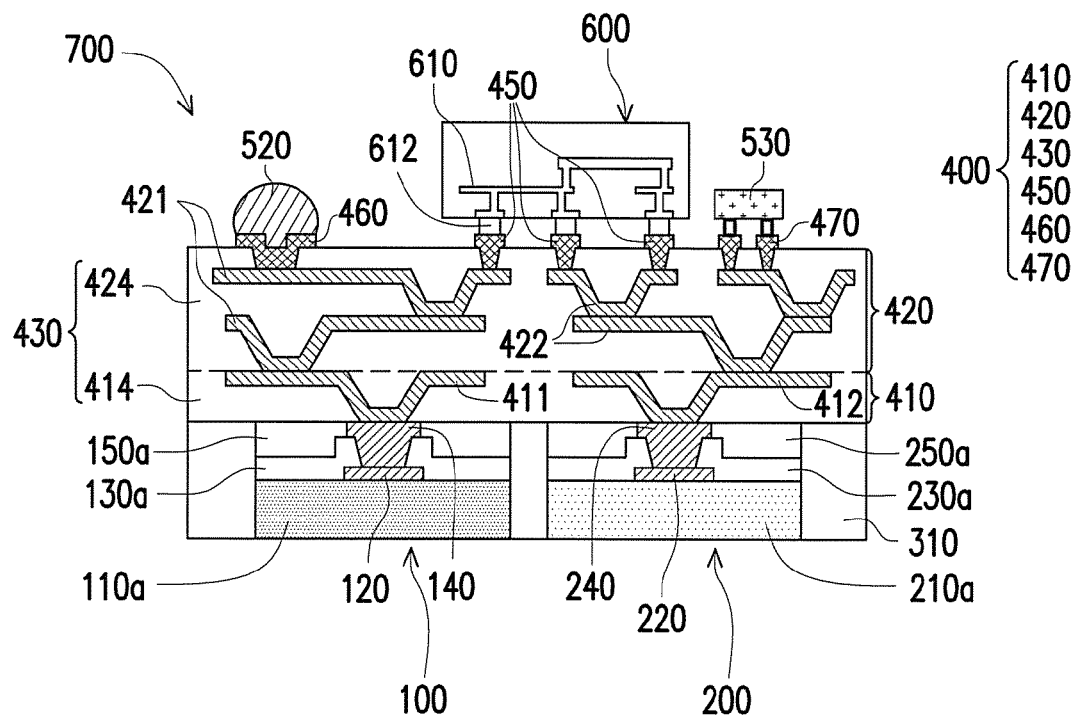

Referring to FIG. 2H, after the bridge structure 600 is connected with the joining portions 450 of the second redistribution layer 420, a wafer dicing process is performed and a plurality of integrated fan-out packages 700 are formed subsequently. In some embodiments, the wafer dicing process is performed by cutting through the redistribution structure 400 and the molding compound 310 so as to separate the integrated fan-out packages 700. In some embodiments, the manufacturing process described above is part of a wafer level packaging process, and a plurality of integrated fan-out packages 700 is obtained after the wafer dicing process. After the wafer dicing process, the packages 700 are debonded from the carrier C and the carrier C is removed.

Figure 3A:
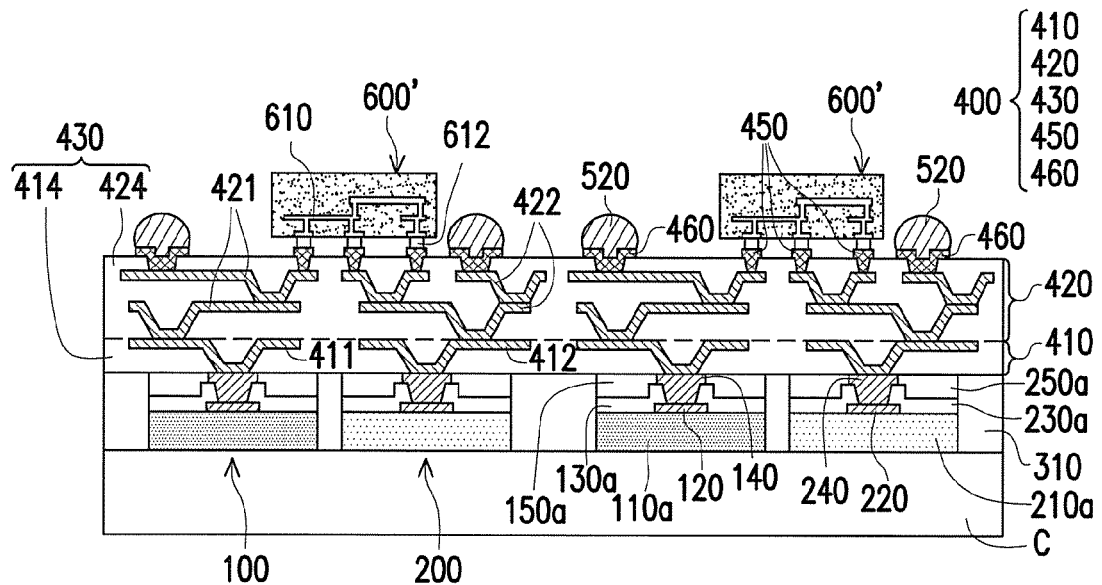
FIGS. 3A-3B are the cross-sectional views showing the integrated fan-out package at various stages of the method of fabricating an integrated fan-out package according to some embodiments of the present disclosure.
Figure 3B:
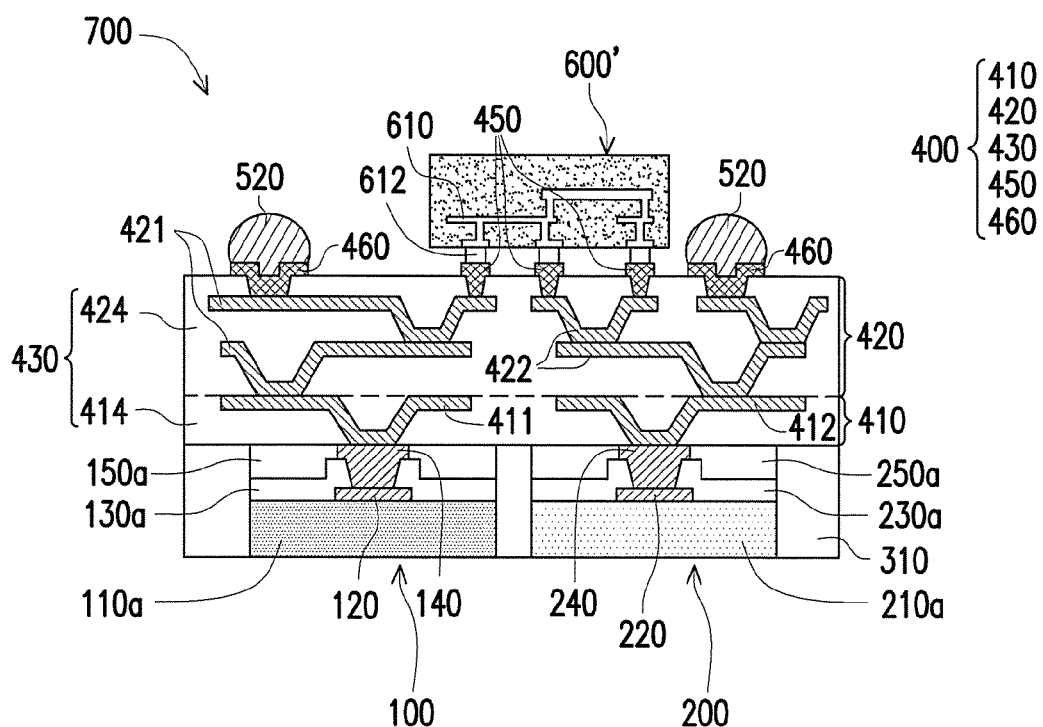

FIGS. 3A-3B are the schematic cross-sectional views showing the integrated fan-out package at various stages of the method of fabricating an integrated fan-out package according to some embodiments of the present disclosure. Referring to FIG. 3A, after forming the second redistribution layer 420 as shown in the step of FIG. 2E, a plurality of joining portions 450 and ball pads 460 are formed on the second redistribution layer 420 of the redistribution structure 400. In some embodiments, some of the joining portions 450 and some of the ball pads 460 are either disposed on the metallization layer 421 or the metallization layer 422. The formation and/or materials of the joining portions 450 and ball pads 460 are similar with the examples of FIG. 2F described above.

As shown in FIG. 3A, a plurality of solder balls 520 is disposed on the second redistribution layer 420, wherein the solder balls 520 are joined with the ball pads 520 of the second redistribution layer 420. In some embodiments, as shown in FIG. 3A, one or more integrated passive devices (not shown) are integrated within the bridge structure 600'. Compared with the structure shown in the example of FIGS.

2F-2G, there is no need to form contact structures for additional integrated passive devices. In certain embodiments, one or more bridge structures 600' are disposed on the joining portions 450 on the second redistribution layer 420. In certain embodiments, at least one of the bridge structures 600' is joined with both the joining portion(s) 450 on the metallization layer 421 and the joining portion(s) 450 on the metallization layer 422 of the second redistribution layer 420, so that the first die 100 is electrically connected to the second die 200 through the first redistribution layer 410, the second redistribution layer 420 and the bridge structure 600'. In some embodiments, except for having an integrated passive device integrated therein, the bridge structure 600' comprises an interconnect structure 610 and bonding structures 612 electrically connected to the interconnection structure 610. The interconnect structure 610 and the bonding structures 612 of the bridge structure 600' are similar to the interconnect structure 610 and the bonding structures 612 described in the example of FIG. 2G. Thus, the detailed description of the interconnect structure 610 and bonding structures 612 will not be repeated herein.

Next, referring to FIG. 3B, after the bridge structure 600' is bonded with the joining portions 450 of the second redistribution layer 420, a wafer dicing process is performed and a plurality of integrated fan-out packages 700 are formed subsequently. After the wafer dicing process, the packages 700 are debonded from the carrier C and the carrier C is removed. In some embodiments, within the integrated fan-out packages 700, the first die 100 is electrically connected with the second die 200 through the bridge structure 600' as well as the redistribution structure 400. In certain embodiments, some solder balls 520 are electrically connected to one of the first die 100 and some solder balls 520 are electrically connected to the second die 200. In some embodiments, the manufacturing process described above is part of a wafer level packaging process, and a plurality of integrated fan-out packages 700 is obtained after the wafer dicing process.

In the above embodiments, even with the presence of the redistribution structure 400, the first die 100 and the second die 200 electrically are unconnected and isolated without the presence of an external bridge structure (600/600'). After bonding with the bridge structure, the first die 100 and the second die 200 are electrically connected to each other through an additional external bridge structure (600/600') that is disposed on and connected to the redistribution structure 400.

In accordance with some embodiments in the present disclosure, there is no need to redesign the layout of the backend metallization for the first and second dies, and the layout of the metallization layer(s) or the redistribution layer of the redistribution structure may be arranged in a more flexible way such that the metallization layer of the redistribution structure needs not to be redistributed for achieving direct die-to-die connection at the metallization layer in contact with the first and second dies. Since an external bridge structure outside of the redistribution structure is used for multi-die connection, the connection to the first and second dies may be achieved through such bridge structure and the connection pattern can be spread out over the whole area of the bridge structure, rather than being limited to extending between peripheries of the first and second dies. That is, changed from forming tracing or connecting lines between the adjacent dies, the die to die connection is achieved through the bridge structure or the array arrangement of the bridge structure above the redistribution structure, which allows the design of the metallization layers for die connection to be more flexible. The die to die connection is no longer limited to the shortest distance (2D coplanar area) between the two dies, and die to die connection pattern at the redistribution layer is omitted. Instead, the electrical connection among adjacent dies is achieved through the external bridge structure along with the redistribution layers or redistribution structure. The yield of the package is increased with lower costs as the yield loss of the package is lessened by skipping the need for re-designed layout and verification steps of the redistribution structure.

In some embodiments of the present disclosure, an integrated fan-out package comprising a first die and a second die, a molding compound, a redistribution structure, ball pads and a bridge structure is described. The first die and the second die are arranged adjacent to each other. The molding compound encapsulates the first and second dies and separates the first die from the second die. The redistribution structure is disposed over the molding compound and on the first die and the second die, wherein the redistribution structure comprises: a first connection structure electrically connected to the first die; a second connection structure electrically connected to the second die; and an inter-dielectric layer located between the first and second connection structures and separating the first connection structure from the second connection structure. The ball pad is disposed on the redistribution structure, wherein the ball pads are electrically connected with the first die through the first connection structure or are electrically connected with the second die through the second connection structure. The bridge structure is disposed on the first connection structure and on the second connection structure of the redistribution structure and electrically connecting the first die to the second die through the first connection structure and the second connection structure.

In some embodiments of the present disclosure, an integrated fan-out package comprising a first die and a second die, a molding compound, a redistribution structure, a plurality of ball pads, joining portions and a bridge structure is described. The second die is arranged aside of the first die. The molding compound encapsulates the first and second dies and separates the first die from the second die. The redistribution structure is disposed on the molding compound and on the first and second dies, wherein the redistribution structure comprises: a first metallization layer connected to the first die and a second metallization layer connected to the second die; an inter-dielectric layer covering the first metallization layer and the second metallization layer and separating the first metallization layer from the second metallization layer; a redistribution layer disposed on the inter-dielectric layer. The plurality of ball pads is disposed on the redistribution layer and electrically connected to the redistribution layer. The joining portions are disposed on and electrically connected to the redistribution layer, wherein a portion of the joining portions is electrically connected to the first metallization layer and another portion of the joining portions is electrically connected to the second metallization layer. The bridge structure is bonded to the joining portions of the redistribution layer and electrically connects the first die to the second die through the first metallization layer, the second metallization layer, the redistribution layer and the joining portions.

In some embodiments of the present disclosure, a method of fabricating an integrated fan-out package is described. A first die and a second die is disposed on a carrier. A molding compound is formed encapsulating the first and second dies and separating the first die from the second die. A first redistribution layer is formed comprising a first metallization layer connected to the first die and a second metallization layer connected to the second die, wherein the first and second metallization layers are separate from each other and the first die is electrically isolated from the second die. A second redistribution layer is formed on the first redistribution layer. Ball pads and joining portions are formed on the second redistribution layer, wherein a portion of the joining portions is electrically connected to the first metallization layer and another portion of the joining portions is electrically connected to the second metallization layer. Solder balls are disposed on the second redistribution layer and the solder balls are joined to the ball pads on the second redistribution layer. A bridge structure is disposed on the second redistribution layer, and the bridge structure are bonded with at least one of the portion of the joining portions and at least one of the another portion of the joining portions on the second redistribution layer to electrically connecting the first die with the second die through the first and second redistribution layers, the joining portions and the bridge structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
a first die and a second die arranged adjacent to the first die;
a molding compound encapsulating the first and second dies and separating the first die from the second die;
a redistribution structure disposed over the molding compound and on the first die and the second die, wherein the redistribution structure comprises:
a first connection structure electrically connected to the first die;
a second connection structure electrically connected to the second die; and
an inter-dielectric layer located between the first and second connection structures and separating the first connection structure from the second connection structure;
ball pads disposed on the redistribution structure, wherein the ball pads are electrically connected with the first die through the first connection structure or are electrically connected with the second die through the second connection structure; and
a bridge structure disposed on the first connection structure and on the second connection structure of the redistribution structure and electrically connecting the first die with the second die through the first connection structure and the second connection structure.

2. The integrated fan-out package according to claim 1, wherein the redistribution structure further comprises joining portions disposed between the bridge structure and the first connection structure and between the bridge structure and the second connection structure, and the joining portions electrically connect the bridge structure with the redistribution structure.

3. The integrated fan-out package according to claim 2, wherein the bridge structure comprises an interconnect structure, and the joining portions are electrically connected to the interconnect structure of the bridge structure.

4. The integrated fan-out package according to claim 1, wherein the redistribution structure further comprises a contact structure disposed on the first connection structure or disposed on the second connection structure.

5. The integrated fan-out package according to claim 4, further comprising an integrated passive device (IPD) disposed on the contact structure and the contact structure electrically connects the IPD with the redistribution structure.

6. The integrated fan-out package according to claim 1, wherein the bridge structure comprises an integrated passive device (IPD) integrated therein.

7. The integrated fan-out package according to claim 1, wherein the first die is a memory chip and the second die is an application processor chip.

8. An integrated fan-out package, comprising:
a first die and a second die arranged aside the first die;
a molding compound encapsulating the first and second dies and separating the first die from the second die;
a redistribution structure disposed on the molding compound and on the first and second dies, wherein the redistribution structure comprises:
a first metallization layer connected to the first die and a second metallization layer connected to the second die;
an inter-dielectric layer covering the first metallization layer and the second metallization layer and separating the first metallization layer from the second metallization layer; and
a redistribution layer disposed on the inter-dielectric layer;
a plurality of ball pads disposed on the redistribution layer and electrically connected to the redistribution layer;
joining portions disposed on and electrically connected to the redistribution layer, wherein a portion of the joining portions is electrically connected to the first metallization layer and another portion of the joining portions is electrically connected to the second metallization layer; and
a bridge structure bonded to the joining portions on the redistribution layer and electrically connecting the first die with the second die through the first metallization layer, the second metallization layer, the redistribution layer and the joining portions.

9. The integrated fan-out package according to claim 8, wherein the bridge structure comprises an interconnect structure, and the interconnect structure of the bridge structure is electrically connected to at least one of the portion of the joining portions and at least one of the another portion of the joining portions.

10. The integrated fan-out package according to claim 8, wherein the redistribution structure further comprises a contact structure disposed on the redistribution layer.

11. The integrated fan-out package according to claim 10, further comprising an integrated passive device (IPD) disposed on the contact structure and the contact structure electrically connects the IPD with the redistribution structure.

12. The integrated fan-out package according to claim 8, wherein the bridge structure comprises an integrated passive device (IPD) integrated therein.

13. The integrated fan-out package according to claim 8, wherein the first die is a memory chip and the second die is an application processor chip.

14. A method of fabricating an integrated fan-out package, comprising:
- disposing a first die and a second die on a carrier;
- forming a molding compound encapsulating the first and second dies and separating the first die from the second die;
- forming a first redistribution layer comprising a first metallization layer connected to the first die and a second metallization layer connected to the second die, wherein the first and second metallization layers are separate from each other and the first die is electrically isolated from the second die;
- forming a second redistribution layer on the first redistribution layer;
- forming ball pads and joining portions on the second redistribution layer, wherein a portion of the joining portions is electrically connected to the first metallization layer and another portion of the joining portions is electrically connected to the second metallization layer;
- disposing solder balls on the second redistribution layer and joining the solder balls to the ball pads on the second redistribution layer; and
- disposing a bridge structure on the second redistribution layer and bonding the bridge structure with at least one of the portion of the joining portions and at least one of the another portion of the joining portions on the second redistribution layer to electrically connecting the first die with the second die through the first and second redistribution layers, the joining portions and the bridge structure.

15. The method of claim 14, further comprises forming a contact structure on second redistribution layer of the redistribution structure.

16. The method of claim 14, further comprises forming an integrated passive device (IPD) that is integrated within the bridge structure.

17. The method of claim 14, wherein bonding the bridge structure with the joining portions comprises eutectic bonding.

18. The method of claim 14, wherein bonding the bridge structure with the joining portions is performed after disposing the solder balls on the ball pads.

19. The method of claim 14, wherein forming the second redistribution layer comprises forming third metallization layers connected to the first metallization layer and forming fourth metallization layers connected to the second metallization layer, and the third metallization layers are separate from the fourth metallization layers.

20. The method of claim 14, wherein the first die is a memory chip and the second die is an application processor chip.

* * * * *